US008863055B2

(12) United States Patent
Nieuwoudt et al.

(10) Patent No.: US 8,863,055 B2
(45) Date of Patent: *Oct. 14, 2014

(54) CAPACITANCE EXTRACTION FOR ADVANCED DEVICE TECHNOLOGIES

(71) Applicant: Synopsys, Inc., Mountain View, CA (US)

(72) Inventors: Arthur Nieuwoudt, San Francisco, CA (US); Jiyoun Kim, Suwon (KR); Mathew Koshy, San Mateo, CA (US); Baribrata Biswas, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/972,464

(22) Filed: Aug. 21, 2013

(65) Prior Publication Data
US 2013/0339915 A1 Dec. 19, 2013

Related U.S. Application Data

(62) Division of application No. 13/357,544, filed on Jan. 24, 2012, now Pat. No. 8,522,181.

(51) Int. Cl.
*G06F 17/50* (2006.01)
(52) U.S. Cl.
CPC ........ *G06F 17/5081* (2013.01); *G06F 17/5036* (2013.01)
USPC .............................. 716/111; 716/115; 716/122
(58) Field of Classification Search
USPC .......................................... 716/111, 115, 122
See application file for complete search history.

(56) References Cited

U.S. PATENT DOCUMENTS

| 4,370,669 | A  | * | 1/1983  | Donley ........................... 257/398 |
| 5,903,469 | A  | * | 5/1999  | Ho ................................. 716/115 |
| 6,503,774 | B2 |   | 1/2003  | Tsai |
| 7,281,223 | B2 |   | 10/2007 | Kiel et al. |
| 7,383,521 | B2 | * | 6/2008  | Smith et al. .................... 716/114 |
| 7,587,691 | B2 |   | 9/2009  | Sutjahjo et al. |
| 7,669,161 | B2 | * | 2/2010  | Lin .................................. 716/55 |
| 7,684,969 | B2 | * | 3/2010  | Habitz et al. .................... 703/14 |
| 7,774,726 | B2 | * | 8/2010  | White ............................. 716/51 |
| 8,001,516 | B2 | * | 8/2011  | Smith et al. .................... 716/136 |
| 8,286,112 | B2 |   | 10/2012 | Miranda et al. |

(Continued)

OTHER PUBLICATIONS

Kavalieros, et al., "Tri-Gate Transistor Architecture with High-k Gate Dielectrics, Metal Gates and Strain Engineering" Components Research, Technology and Manufacturing Group, Intel Corporation, Proc. Symposium on VLSI Technology, 2006, 2 pages.

(Continued)

*Primary Examiner* — Naum Levin
(74) *Attorney, Agent, or Firm* — HIPLegal LLP; Judith A. Szepesi

(57) ABSTRACT

A method and apparatus to provide a capacitance to a design an integrated circuit is described. In one embodiment, the method receive a layout of the integrated circuit and applying canonical hierarchical models to the layout, wherein the canonical hierarchical models include a first type canonical model to capture a first capacitance of a device having a plurality of first conductors and a second type canonical model to capture a second capacitance between at least a portion of the device and one or more second conductors of the integrated circuit. The method further includes determining a capacitance for the layout based on the applying.

18 Claims, 10 Drawing Sheets

(56) References Cited

U.S. PATENT DOCUMENTS

| | | | |
|---|---|---|---|
| 8,522,181 B2* | 8/2013 | Nieuwoudt et al. | 716/111 |
| 2002/0053066 A1 | 5/2002 | Richter et al. | |
| 2002/0055193 A1 | 5/2002 | Tsai | |
| 2004/0049370 A1 | 3/2004 | Stanley et al. | |
| 2006/0048081 A1 | 3/2006 | Kiel et al. | |
| 2010/0058260 A1* | 3/2010 | Correale et al. | 716/5 |
| 2013/0212551 A1* | 8/2013 | Ogawa et al. | 716/133 |

OTHER PUBLICATIONS

Mistry, et al., "A 45nm Logic Technology with High-k+Metal Gate Transistors, Strained Silicon, 9 Cu Interconnect Layers, 193nm Dry Patterning, and 100% Pb-free Packaging" Logic Technology Development, Intel Corporation, IEEE, 2007, pp. 247-250.

* cited by examiner

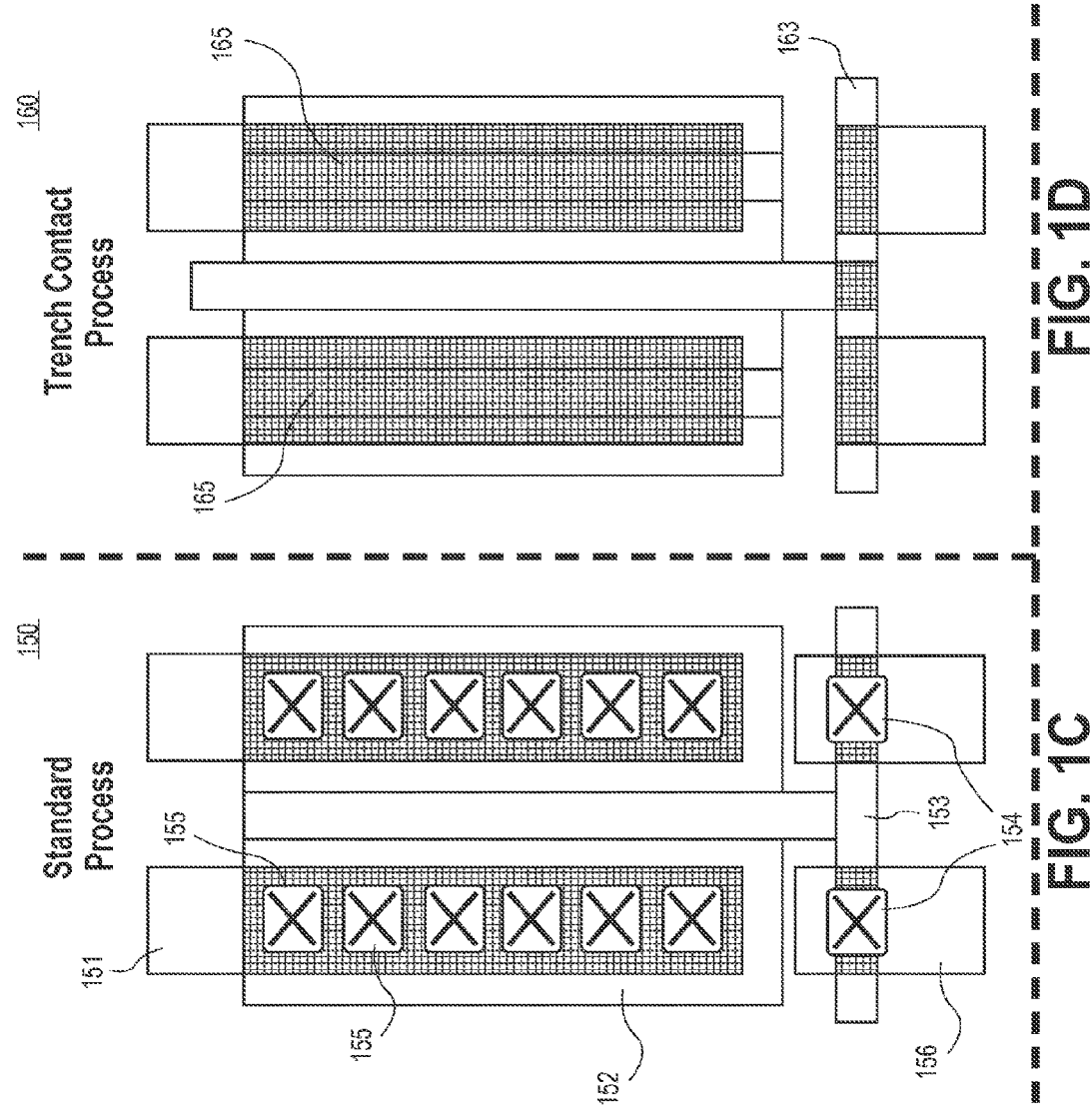

CAPACITANCE EXTRACTION FOR ADVANCED DEVICE TECHNOLOGIES

RELATED APPLICATION

The present application is a divisional of U.S. patent application Ser. No. 13/357,544, filed Jan. 24, 2012, now U.S. Pat. No. 8,522,181, issuing on Aug. 27, 2013.

FIELD

Embodiments as described herein relate to designing of integrated circuits, and more particularly to capacitance extraction for an integrated circuit design.

BACKGROUND

For the design of integrated circuits (ICs) (e.g., on the scale of Very Large Scale Integration (VLSI) technology), designers often employ computer-aided techniques. Standard languages such as Hardware Description Languages (HDLs) have been developed to describe digital circuits to aid in the design and simulation of complex digital circuits. Generally, hardware description languages, e.g., VHDL and Verilog allow definition of a hardware model at a gate level, a register transfer level (RTL) or a behavioral level using abstract data types. As device technology continues to advance, various product design tools have been developed to adapt HDLs for use with newer devices and design styles.

Typically, in designing an integrated circuit with an HDL code, the code is first written and then compiled by an HDL compiler. The HDL source code describes at some level the circuit elements, and the compiler produces an RTL netlist from this compilation. The RTL netlist is typically a technology independent netlist in that it is independent of the technology/architecture of a specific vendor's integrated circuit, such as field programmable gate arrays (FPGA) or an application-specific integrated circuit (ASIC). The RTL netlist corresponds to a schematic representation of circuit elements (as opposed to a behavioral representation). A mapping operation is then performed to convert from the technology independent RTL netlist to a technology specific netlist, which can be used to create circuits in the vendor's technology/architecture. It is well known that FPGA vendors utilize different technology/architecture to implement logic circuits within their integrated circuits. Thus, the technology independent RTL netlist is mapped to create a netlist, which is specific to a particular vendor's technology/architecture.

Integrated Circuits (ICs) are used in numerous applications, e.g., handheld devices, such as cellular phones, wristwatch cameras, organizers, and others. As the commercial markets and consumer demands for smaller Integrated Circuits grow, IC size requirement trends continue towards a small form factor and lowered power consumption.

Integrated circuits include millions of metal oxide semiconductor field effect transistors ("MOSFET"). The steady downscaling of MOS transistor dimensions has been the main stimulus to the growth of microelectronics and the computer industry over the past two decades.

Advanced integrated circuit device process technologies that provide submicron device feature sizes (e.g., no greater than 22 nanometers (nm)) can contain complex conductor geometries in a device region. The complex conductor geometries include, for example, multi-gate devices (e.g., FinFETs), trench contacts, raised source/drain regions (RSD), and other conductor geometries.

FIG. 1A is a perspective view of a FinFET transistor structure 100. The transistor structure has a source region 105 and a drain region 107 at opposite sides of the gate electrode 101. A portion of the gate 103 wraps around the fin. The gate electrode 101 with underlying gate dielectric covers the top and the two opposing sidewalls of the portion of the fin body 103. This effectively triples the space available to more effectively control the device channel in order to give the FinFET transistor substantially higher performance than the conventional planar transistors.

FIG. 1B is a perspective view of a multi-gate transistor structure 110. The multi-gate transistor structure 110 has a raised source region 117 and a raised drain region 115 having multiple fins on a substrate 113. As shown in FIG. 1B, a portion 112 of a gate 111 is formed over the fins connecting the raised source region 117 and raised drain region 115. As shown in FIG. 1B, structure 110 provides multiple gate channels over the fins of the raised drain/source regions 115 and 117.

FIG. 1C shows a device region layout in a traditional contact process 150. The traditional contact process involves creating a plurality of via-based contacts, such as via contacts 153 and via contacts 155. As shown in FIG. 1C, each of the via contacts 155 connects a lowest routing layer 151 (M1) and a diffusion 152 (e.g., source/drain regions). As shown in FIG. 1C, each of the via contacts 153 connects a lowest routing layer 156 (M1) to a poly gate 154.

Currently, most process technologies providing a feature size 22 nm and smaller have trench contacts in the device region. Trench contacts typically serve two purposes: they physically connect a lowest routing layer (e.g., M1 layer) to a poly (e.g., a gate contact) and physically connect a lowest routing layer (e.g., M1 layer) to the diffusion (e.g., source/drain contact regions) in the device region. In this capacity, trench contacts replace traditional via-like contacts.

FIG. 1D shows a device region layout in a trench contact process 160. As shown in FIG. 1D, in the trench contact process via contacts 155 are replaced by a trench contact 165, and via contacts 153 are replaced by a trench contact 163. Trench contacts can be used for local routing purposes between devices. Trench contacts have several advantages over standard via-based contacts including increased layout density, improved reliability and performance, and ease of patterning for sub-micron lithography.

Current process technologies that include the aforementioned advanced process features have several challenging characteristics for capacitance extraction. The process technologies with trench contacts can contain a large number (>10) of conducting layers. These conducting layers are in close proximity and have unique physical characteristics that provide a challenge for capacitance extraction of a large-scale integrated circuit design. Further, the advanced process features such as trench contacts, RSDs, and multi-gate device geometries are context dependent with respect to non-rectangular conductor geometries and conformal dielectric configurations. Furthermore, trench contact conductors can be used for local interconnect routing or inter-layer connectivity within a device. The capacitive behavior of trench contacts in these two scenarios is significantly different.

The existing methods can compute the capacitance associated with a given conductor geometry directly using numerical techniques. These methods, however, do not have sufficient speed or capacity for extracting large-scale designs.

SUMMARY OF THE DESCRIPTION

Methods and apparatuses to provide capacitance extraction for integrated circuits including advance device technologies are described. Technology specific information to design the integrated circuit is received. Canonical hierarchical models to capture an integrated circuit capacitance are created. In at least some embodiments, the canonical hierarchical models include a canonical model of a first type to capture a capacitance of a device having a plurality of conductors, and a canonical model of a second type to capture a capacitance between at least a portion of the device and one or more other conductors of the integrated circuit. In at least some embodiments, a canonical model of a third type to capture a capacitance between the one or more conductors of the integrated circuit is created. In at least some embodiments, the canonical model of the second type is configured to bridge the canonical model of the first type and the canonical model of the third type.

In at least some embodiments, a layout of the integrated circuit is received. Canonical hierarchical models including a first type canonical model to capture a capacitance of a device having a plurality of conductors and a second type canonical model to capture a capacitance between at least a portion of the device and one or more conductors of the integrated circuit can be applied to the layout. A capacitance for the layout can be determined based on the canonical hierarchical models. The canonical hierarchical models can be applied to a layout of the integrated circuit.

Other features as described herein will be apparent from the accompanying drawings and from the detailed description which follows.

BRIEF DESCRIPTION OF THE DRAWINGS

The embodiments as described herein are illustrated by way of example and not limitation in the figures of the accompanying drawings in which like references indicate similar elements.

FIG. 1C shows a device region layout in a traditional contact process.

FIG. 1D shows a device region layout in a trench contact process.

DETAILED DESCRIPTION

Figure 1B:
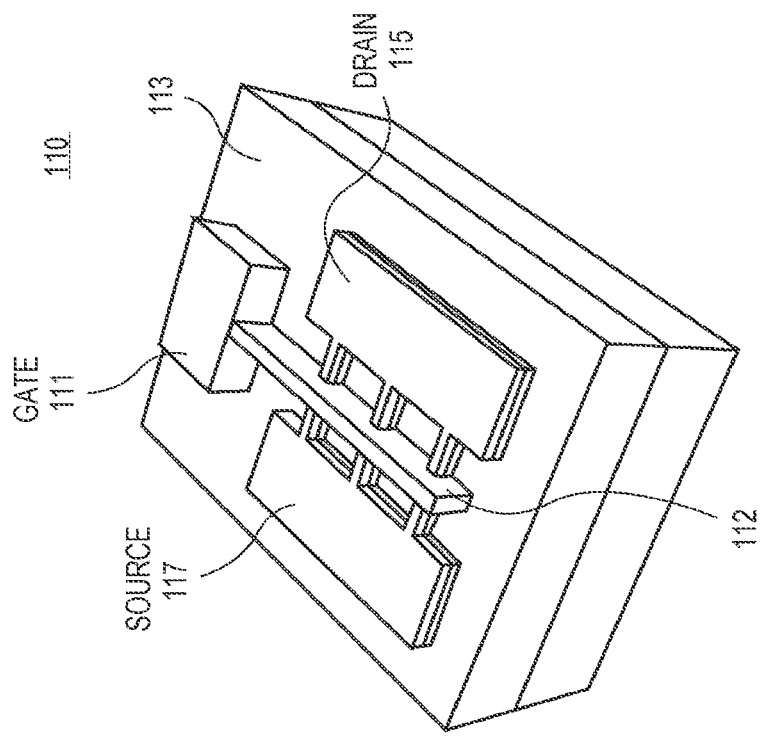
FIG. 1B is a perspective view of a multi-gate transistor structure.
Figure 1A:
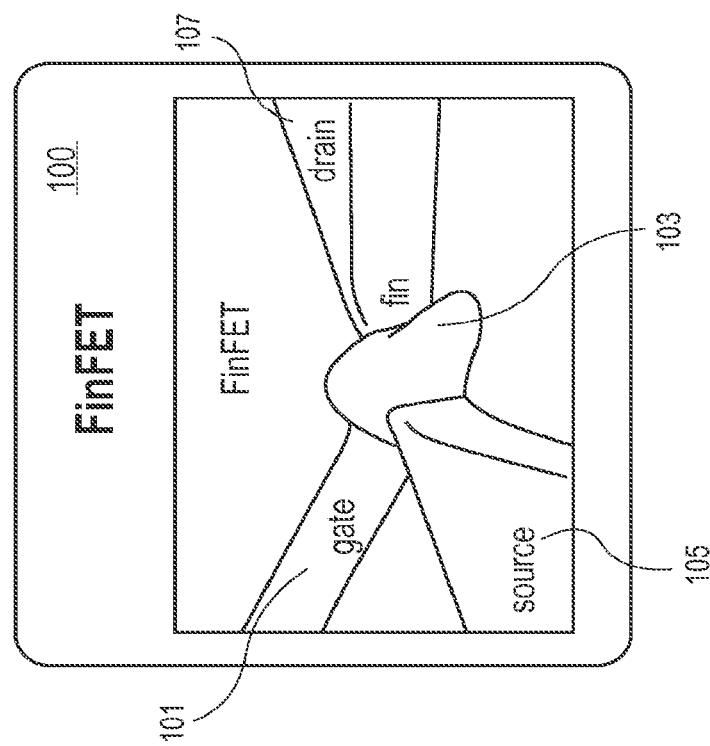
FIG. 1A is a perspective view of a FinFET transistor structure.

The following description and drawings are illustrative and are not to be construed as limiting. Numerous specific details are described to provide a thorough understanding of embodiments as described herein. However, in certain instances, well known or conventional details are not described in order to avoid obscuring the description. References to an embodiment or one embodiment in the present disclosure are not necessary to the same embodiment; and, such references mean at least one.

Methods and apparatuses as described herein provide hierarchical modeling methodology for capacitance extraction of advanced devices. Hierarchical two dimensional (2D)/three dimensional (3D) models are constructed to accurately and efficiently capture complex device interactions for a capacitance extraction for an integrated circuit design.

At least some embodiments provide an accurate and efficient transistor-level capacitance extraction methodology for advanced device technologies including trench contacts. In at least some embodiments, 2D/3D base models for device region scenarios including trench contacts and advanced device characteristics (RSD and multi-gate) are constructed, as described in further detail below. In at least some embodiments, hybrid base models are constructed to combine device region conductors, for example, trench contacts with standard interconnect conductors, as described in further detail below.

In at least some embodiments, capacitance data from the device and hybrid models are combined with standard interconnect models during device region extraction using a superposition operation, a scaling operation, a substitution operation, a direct application operation, or any combination thereof, as described in further detail below. Combining the capacitance data from the device and hybrid models with standard interconnect models using a superposition operation, a scaling operation, a substitution operation, a direct application operation, or any combination thereof operations may be needed because the direct modeling of all possible scenarios in the device region layout can be intractable.

Methods and apparatuses as described herein combine the computational efficiency and large capacity of traditional pattern matching based interconnect extraction with the increased accuracy provided by the targeted device and hybrid models and their effective application during extraction. Methods and apparatuses as described herein enable foundries and designers to effectively capture transistor-level capacitances in 22 nm and below technologies that contain recently developed process features including trench contacts, RSD, and multi-gate devices. Methods and apparatuses as described herein have substantially greater computational efficiency than existing field solver methods. Methods and apparatuses described herein resolve transistor-level extraction challenges that require modeling complex physical properties, high accuracy on small capacitances, high performance for block/chip-level extraction.

Methods and apparatuses as described herein address fundamental challenges for the capacitance extraction of large-scale designs in advanced process technologies. The existing methodology uses general interconnect modeling for device region scenarios. In the existing methodology, capacitance data from base models representing canonical interconnect patterns are applied to extract layout geometries. The models used in previously known methods represent standard interconnect routing scenarios, which have limited accuracy when applied to advanced process technologies with trench contacts. Conductor patterns associated with trench contacts are significantly different than those in the standard interconnect or traditional devices that exist in older process technologies. Given the large number of device region conductors in close proximity, building the models for every possible conductor combination is intractable. Context dependent device characteristics present in RSD and multi-gate devices further exasperate this problem.

Applying embodiments described herein to over 30 cases implemented in 20 nm technology with trench contacts and raised source/drain regions, the average extracted capacitance accuracy versus field solver reference values is improved from 25.8% to 1.7% compared with prior methods leveraging traditional interconnect-centric base models.

Figure 2A:
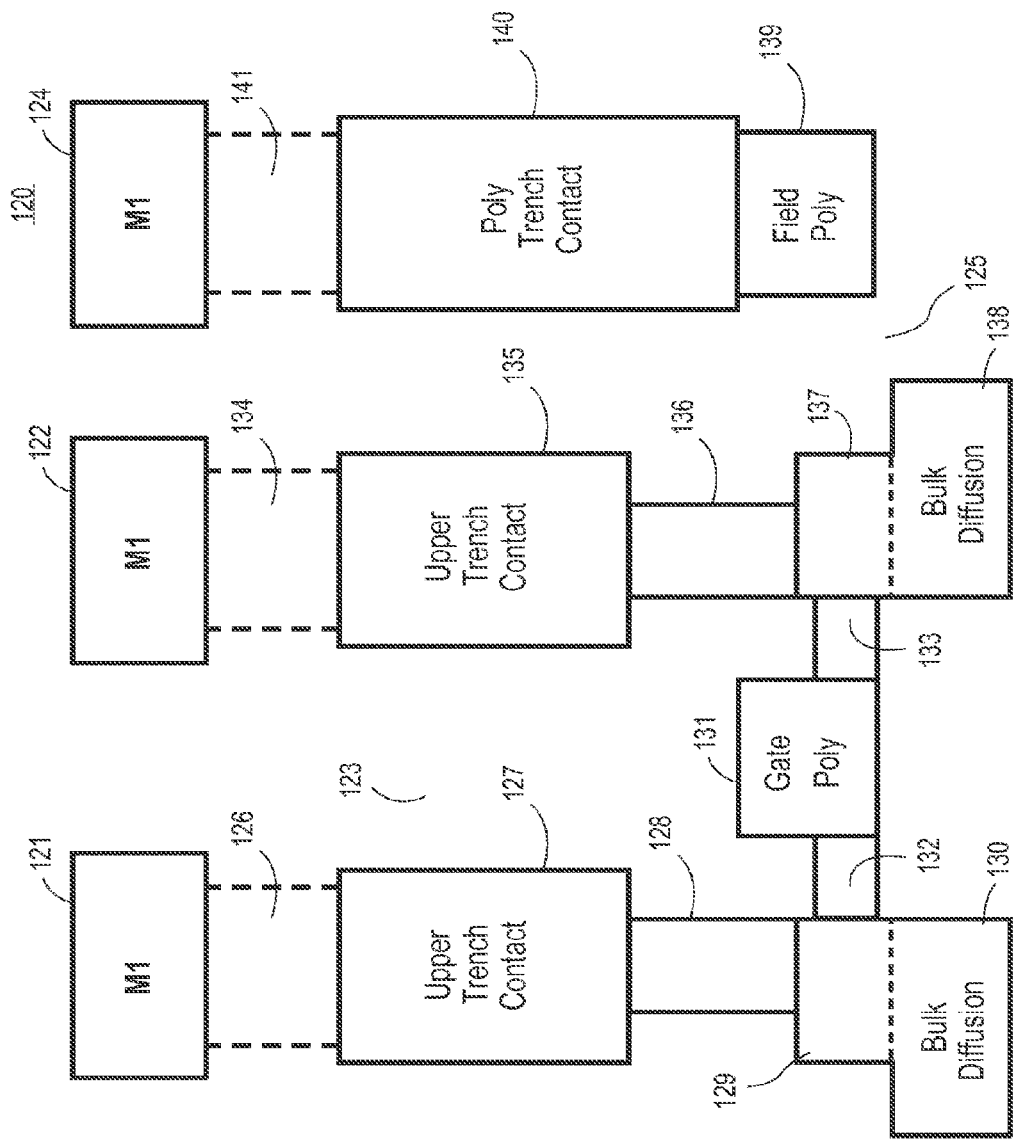
FIG. 2A shows a cross-sectional view of a device portion of an integrated circuit design according to one embodiment.

FIG. 2A shows a cross-sectional view 120 of a device portion of an integrated circuit design according to one embodiment. As shown in FIG. 2A, a device 123 has a gate poly conductor 131 electrically connected through a fin diffusion region conductor 132 to a raised source/drain (RSD) diffusion conductor 129 and through a fin diffusion region conductor 133 to a RSD diffusion conductor 137. RSD conductor 129 is formed on a bulk source/drain diffusion conductor region 130, and RSD conductor 137 is formed on a bulk source/drain diffusion conductor region 138. As shown in FIG. 2A, an upper trench contact (conductor) 127 is electrically connected through a lower trench contact (conductor) 128 to RSD conductor 129, and an upper trench contact (conductor) 135 is electrically connected through a lower trench contact (conductor) 136 to RSD conductor 137. Upper trench conductor 127 is electrically connected through a short via 126 to a conductor 121 of an upper routing layer (e.g., M1 layer). Upper trench conductor 135 is electrically connected through a short via 134 to a conductor 122 of an upper routing layer (e.g., M1 layer). As shown in FIG. 2A, a portion 125 of the integrated circuit design outside device 123 includes a poly trench contact (conductor) 140 electrically connected to a field poly conductor 139 and through a short via 141 to a conductor 124 of an upper routing layer (e.g., M1 layer). In at least some embodiments, device 123 is a multi-gate transistor.

Figure 5:
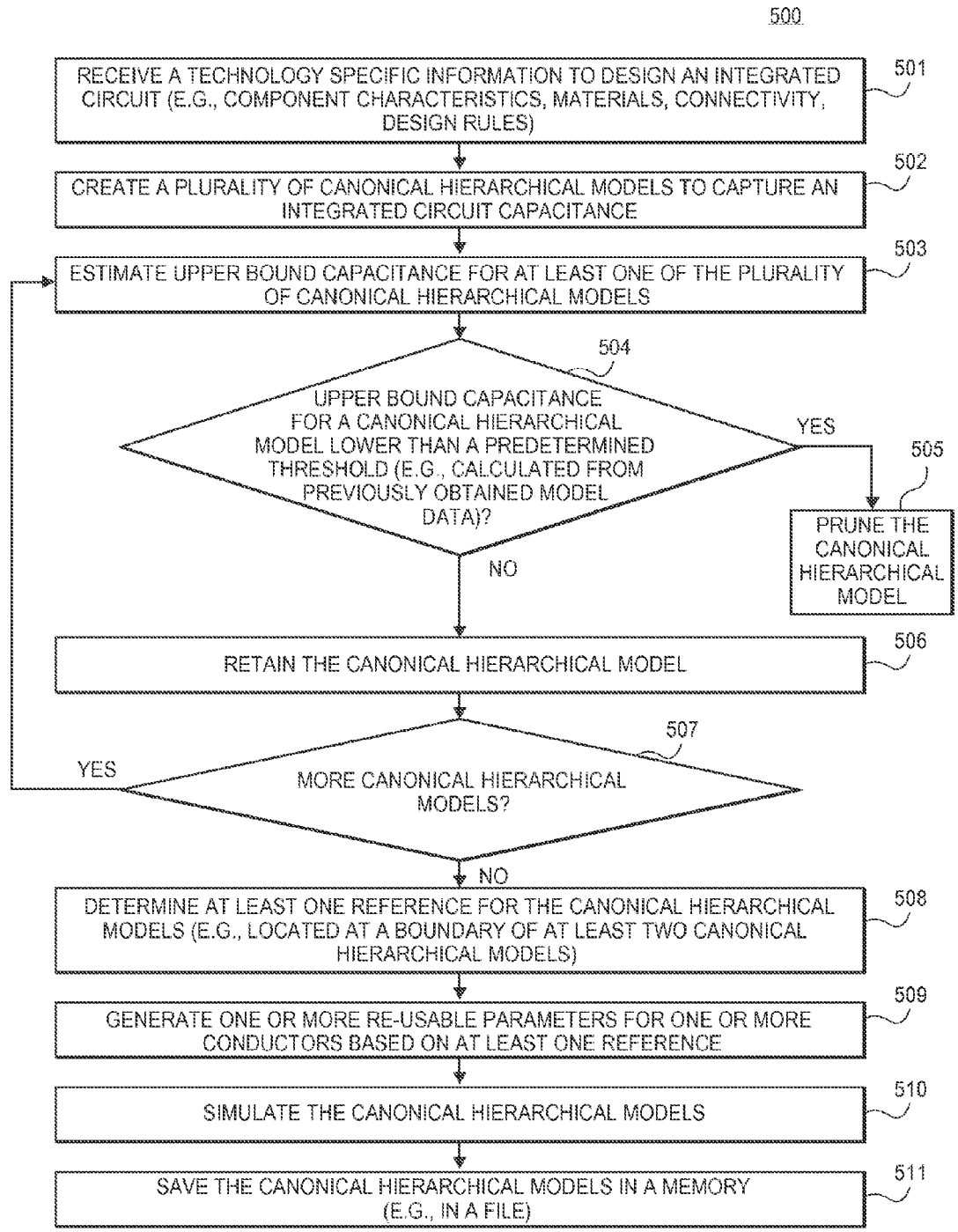
FIG. 5 shows a flowchart of a method to construct and simulate a set of canonical hierarchical models based on a given process technology according to one embodiment.

FIG. 5 shows a flowchart of a method 500 to construct and simulate a set of canonical hierarchical models based on a given process technology according to one embodiment. Method 500 begins at operation 501 that involves receiving process technology specific information to design an integrated circuit, for example, associated with an integrated circuit manufacturer. The integrated circuit has a plurality of components (e.g., conductors, devices, a combination thereof, and other electrical components). For example, the process technology specific information can include characteristics data (e.g., physical geometries, dimensions, functions, materials, dielectric constants, compositions, capacitive behaviors) of the components (e.g., fins, RSDs, trench contacts, and other components of the integrated circuit you would expect to use different models for the same conductor). For example, the process technology specific information can include data about how the integrated circuit components are connected (connectivity), technology stack design rules (e.g., minimum/maximum dimensions of the components, minimum/maximum spacing between the components, component geometry (e.g., one or more sizes), a component location in the integrated circuit, and other design rules. The process technology specific information can be stored in a file.

Method 500 continues with operation 502 involving creating a plurality of canonical (base) hierarchical models to capture an integrated circuit capacitance based on the process technology specific information. For example, creating a plurality of base hierarchical models can involve receiving a conductor having a conductor information to design an integrated circuit, and determining a canonical model for the conductor based on the conductor information. In one embodiment, a canonical hierarchical model has one or more conductors, devices, and other electrical components.

Figure 2B:
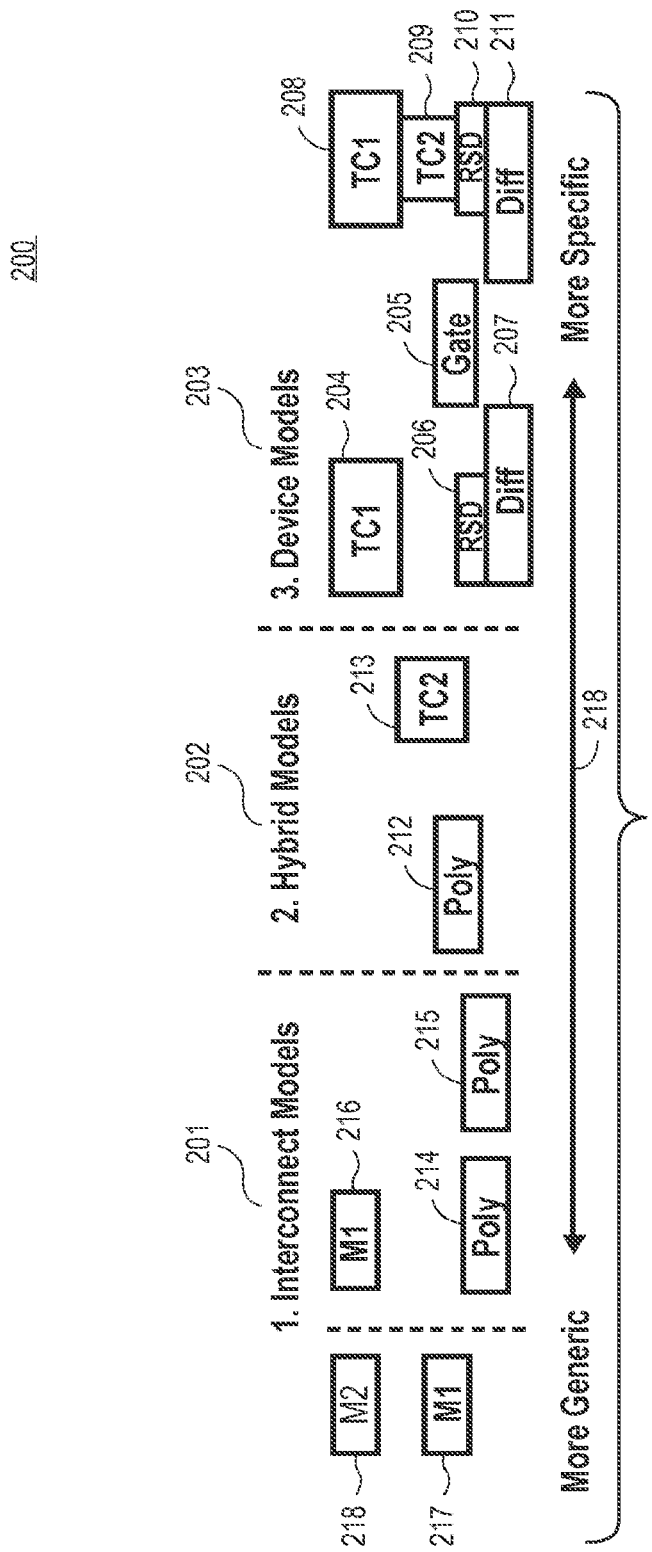
FIG. 2B is a diagram illustrating canonical hierarchical models according to one embodiment.

FIG. 2B is a diagram 200 illustrating canonical hierarchical models according to one embodiment. As shown in FIG. 2B, the canonical hierarchical models, include one or more 2D/3D device type canonical models, such as a device model 203, one or more hybrid models, such as a hybrid model 202, and one or more interconnect models, such as a standard interconnect model 201.

In at least some embodiments, device models specifically represent device and device-like conductor geometries in the process. The device models capture the capacitance of complex conductor geometries in the device region including advanced process features, for example, trench contacts, RSDs, multigate devices, and other advanced process features. In at least some embodiments, a device model represents a device configuration. A 2D/3D device model can represent one or more multi-gate devices, one or more trench contacts, one or more raised diffusions, or a combination thereof. Context specific process features can be handled using hierarchy of device models. In at least some embodiments, the conductor configurations for device models are determined dynamically. In at least some embodiments, parameterization for device models is performed dynamically, as described in further detail below.

In at least some embodiments, hybrid models combine some device region conductors, for example, trench contacts, RSDs, multigate devices, and other advanced process features with standard interconnect conductors. In at least some embodiments, hybrid models bridge a gap between the device models and standard interconnect models. Hybrid models are created to represent device and routing interaction. The hybrid models are adaptively constructed models based on physical and electrical properties of interconnect and device conductors and their interactions. In at least some embodiments, the hybrid models include the special device features which impact on the device and routing interaction is significant. For example, a device feature can be included into a hybrid model if the impact of the device feature on the interaction between the device and routing is greater than is greater than one or more predetermined physical characteristics or electrical values that may be defined either in absolute terms or relative to other calculated physical or electrical values.

In at least some embodiments, interconnect models represent standard routing scenarios that are traditionally used in pattern matching extraction. In at least some embodiments, base models are constructed for standard interconnect scenarios, devices, and hybrid scenarios where device and interconnect conductors including trench contacts interact.

An example of the hierarchy of the canonical models is depicted in FIG. 2B. As shown in FIG. 2B, more generic models are positioned at the left along a horizontal axis 218, and more specific models are depicted at the right along horizontal axis 218. As shown in FIG. 2B, the device models are more specific than the hybrid models, and the hybrid models are more specific than the interconnect models. The interconnect models are more generic than hybrid models, and the hybrid models are more generic than the device models. In at least some embodiments, a device model is at a lowest hierarchical level to capture a capacitive interaction between conductors within a device. In at least some embodiments, a hybrid model is at a higher hierarchical level to capture a capacitance interaction between a device and outside conductors. In at least some embodiments, an interconnect model is at a highest hierarchical level to capture, for example, interactions higher in the stack, or M1 to poly. In at least some embodiments, a hybrid model is created to bridge a device model and an interconnect model. That is, possible physical scenarios (layouts) for the integrated circuit design are decomposed into hierarchical models.

Each type of the canonical models can be associated with a plurality of design layout scenarios. The context specific features (e.g., multi-gate devices, trench contacts, and other context specific features) are handled using hierarchy of the models including 2D/3D models. In at least some embodiments, decomposition of the possible physical scenarios for the integrated circuit design into hierarchical models is performed based on a conductor function (e.g. gate, field poly, trench contact, diffusion, and the like), conductor physical geometry, conductor capacitive behavior, or a combination thereof. The hierarchy of the models is created to cover all possible physical scenarios (layouts) of the integrated circuit design.

A 2D/3D device model is created to capture a capacitance of a device, such as a device 123 of FIG. 2A. The device model comprises a plurality of conductors. For example, the device model can comprise a gate conductor 205, a RSD conductor 206, a bulk diffusion 207, an upper trench contact conductor 204, a lower trench contact conductor 209 between an upper trench contact conductor 208, a RSD 201 between a diffusion 211 and trench contact conductor 209, as shown in FIG. 2B. A hybrid canonical model is created to capture a capacitance between at least a portion of the device, e.g., a device 123 of FIG. 2A, and one or more other conductors of the integrated circuit, e.g., one or more conductors of portion 125 of FIG. 2A. The hybrid model comprises a plurality of conductors. For example, the hybrid model can comprise a lower trench contact conductor 213 of a device and a field poly conductor 212. An interconnect canonical model is created to capture a capacitance between interconnect conductors of the integrated circuit, for example, between poly trench contact conductor 140 and conductor 124 of FIG. 2A. The interconnect model comprises a plurality of conductors. For example, the interconnect model can comprise a conductor of a routing metal layer M2 218, conductors of a routing metal layer M1 216 and 217, field poly conductors 214 and 215, as shown in FIG. 2B.

Given an extremely large number of conductor permutations in the device region for processes with trench contacts, the device models, hybrid models, and interconnect models do not explicitly model every possible scenario. Instead, these models are constructed in a complementary manner to enable accurate capacitance extraction. In at least some embodiments, the model data are combined to extract possible design layout scenarios. In at least some embodiments, because all design layout scenarios cannot be explicitly simulated, the hierarchical models are constructed during capacitance extraction for complementary use.

In at least some embodiments, a bounded error leveraging pre-characterization of the created hierarchical base models is performed. Returning back to FIG. 5, an upper bound capacitance for at least one of the plurality of canonical hierarchical models is estimated at operation 503. At operation 504 it is determined if the upper bound capacitance of a canonical hierarchical model is smaller than a predetermined threshold. In one embodiment, the threshold is calculated from previously obtained model data. For example, the largest capacitance value calculated using a given canonical hierarchical model is compared with a predefined metric based on either an absolute threshold or a relative threshold calculated from data obtained from previously retained canonical hierarchical models. If the upper bound capacitance is smaller than the predetermined threshold, the canonical hierarchical model is pruned at operation 505. If the upper bound capacitance is not smaller than a predetermined threshold, the canonical hierarchical model is retained at operation 506. At operation 507 it is determined if there are more canonical models to pre-characterize. If there is a canonical hierarchical model to pre-characterize, method 500 returns to operation 503. If there are no canonical hierarchical model to pre-characterize, method 500 continues at operation 508 that involves determining a reference for the canonical hierarchical models. In at least some embodiments, the reference is determined as a reference conductor with respect to which parameters of at least two models are generated. The reference for the base models is determined to maintain the parameterization of the models coherent. In at least some embodiments, the reference is a reference conductor which can be included in a base hierarchical model but does not really exist in a base hierarchical model. That is, parameters for the models can be generated with respect to a reference conductor that could be in the model but doesn't necessarily have to be in the model.

At operation 509 one or more re-usable parameters for one or more conductors of the hierarchical models are generated based on the reference. That is, to provide continuity between the hierarchical base models, cross-model parameterization is performed using reusable parameters and reference conductors. Generating the re-usable parameters with respect to one or more reference conductors across the models allows combining these models together.

Figure 4:
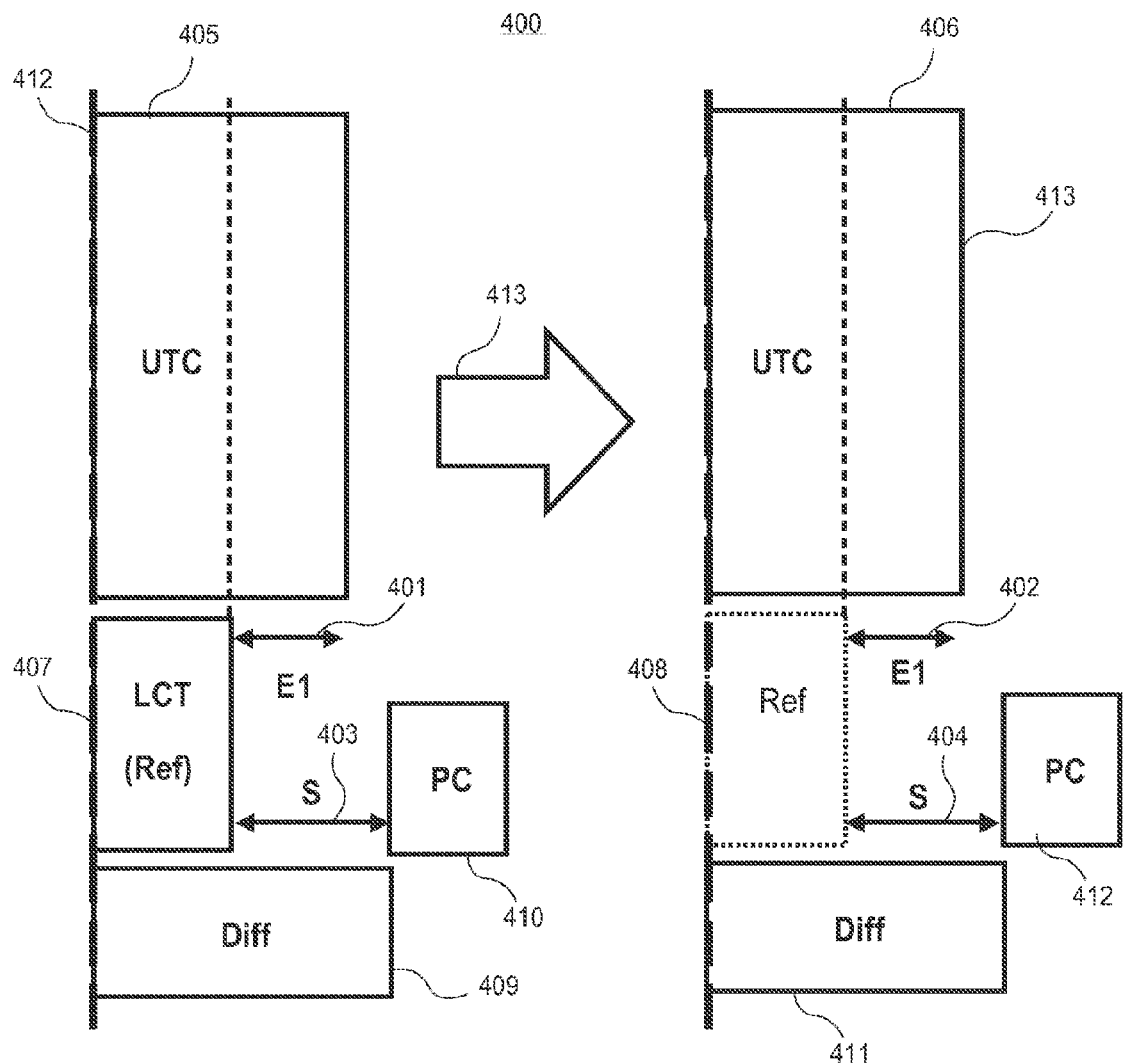
FIG. 4 shows an example of a cross-model parameterization according to one embodiment.

FIG. 4 shows an example 400 of a cross-model parameterization according to one embodiment. A hierarchical base model 412 includes an upper trench contact (UTC) conductor 405, a lower trench contact (LTC) conductor 407, a poly conductor (PC) 410, and a diffusion conductor (Diff) 409. A hierarchical base model 413 includes an UTC conductor 406, a PC 412, and a Diff 411, as shown in FIG. 4. A reference 407 and a reference 408 represent commonality between models 412 and 413. In at least some embodiments, the commonality between the models is a similar geometric property, for example, a size. As shown in FIG. 4, reference 407 is a lower trench contact conductor in a model 412. Reference 408 is a conductor that potentially can be, but does not really exist in model 413. As shown in FIG. 4, the re-usable parameters E1 and S are used in both models 412 and 413. As shown in FIG. 4, in model 412 re-usable parameter E1 applies to an overhang 401 with respect to reference 407. In model 413 re-usable parameter E1 applies to a width adjustment 402. In model 412 parameter S applies to a spacing 401 between the PC and the LTC. In model 413 parameter S applies to a position 402 of the PC.

That is, the re-usable parameters can be applied to different features based on the same basic geometric property of the models. In at least some embodiments, the re-usable parameters are used to combine different models during layout capacitance extraction. In at least some embodiments, one or more reference conductor are selected based on the geometries of the hierarchical base models. In at least some embodiments, a reference conductor is a conductor that is capacitively important in different layout scenarios. That is, there are two aspects of constructing base models. A first aspect involves selecting conductors for a model, and a second aspect involves parameterization of geometries for the selected conductors in the model.

In at least some embodiments, a given conductor is selected as a reference conductor if the given conductor can be in a plurality of models. In at least some embodiments, a given conductor is selected as a reference conductor if the given conductor can be in a portion of a possible integrated circuit layout where at least two different hierarchical base models can be applied. This portion of the integrated circuit design layout is a boundary region between at least two models where these models overlap. The reference conductors represent commonality between the parameters of the models.

In at least some embodiments, one or more hybrid models are created having one or more characteristics that are common to one or more device models. In at least some embodiments, a re-usable parameter is a parameter that is applied in different hierarchical base models. In at least some embodiments, the hierarchical base models of the same type are created with one or more common characteristics (for example, one or more reference conductors). In at least some embodiment, a re-usable parameter is a parameter that is applied in different physical layout scenarios of the same hierarchical base model. In at least some embodiments, model data are combined by lining up a reference conductor between at least two models. In at least some embodiments, the conductors that are selected as reference conductors for the models are saved in a file in a memory of a data processing system. In at least some embodiments, each set of conductors is characterized by a set of parameters in a range (e.g., a range of spacings, a range of widths, a range of dielectric constants, and the like).

Referring back to FIG. 5, method 500 continues with operation 510 that involves simulating the canonical hierarchical models to obtain capacitance data. At operation 511 the canonical hierarchical models are saved in a memory (e.g., in a file). Decomposition and parameterization scheme enables accurate capacitance reconstitution during extraction.

Figure 3:
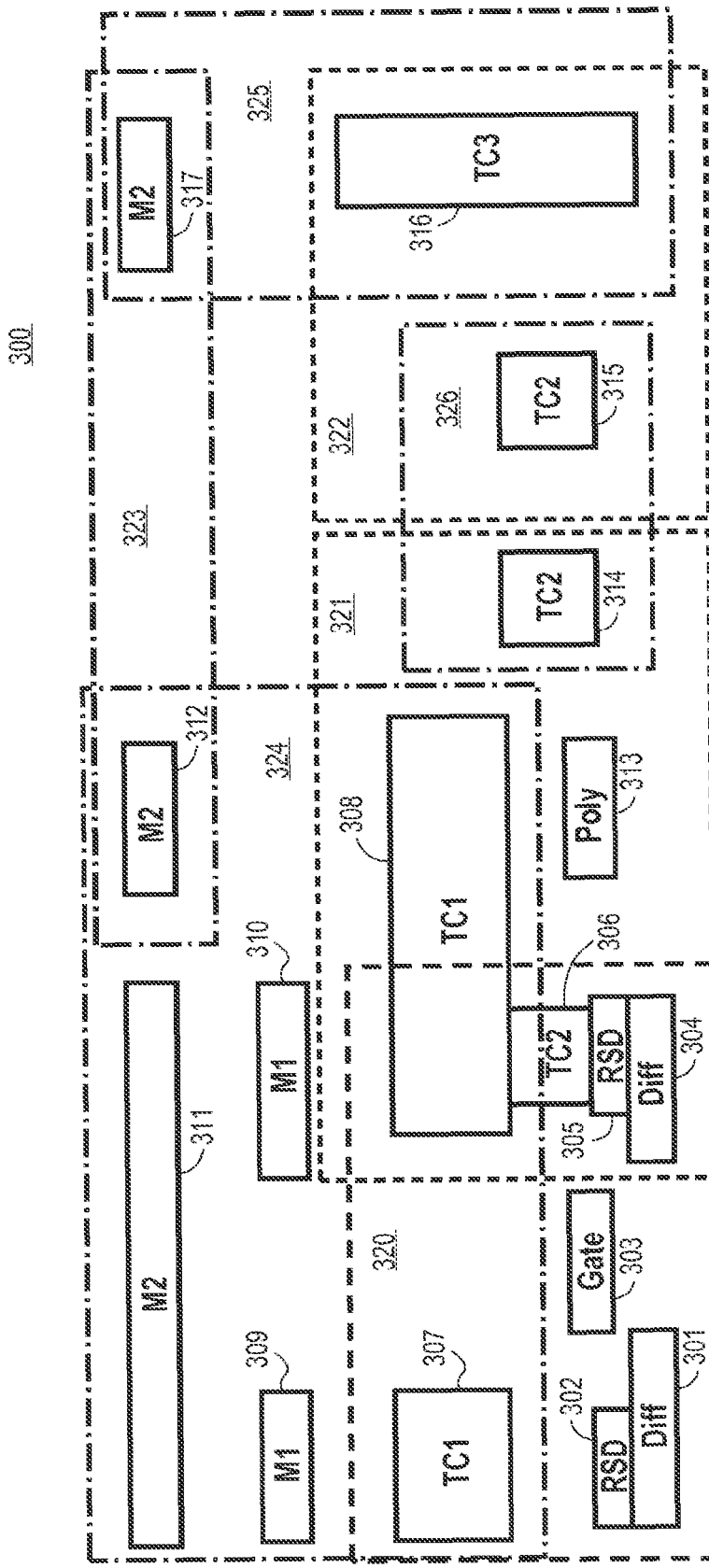
FIG. 3 is a diagram illustrating extracting a capacitance for an exemplary integrated circuit design layout configuration according to one embodiment.

FIG. 3 is a diagram illustrating extracting a capacitance for an exemplary integrated circuit design layout configuration based on canonical hierarchical models according to one embodiment. An integrated circuit design layout 300 is partitioned into a plurality of domains, such as domains 320-326. As shown in FIG. 3, each of the domains includes one or more conductors. As shown in FIG. 3, a domain 320 has an RSD conductor on a top of a diffusion conductor 301, a RSD conductor 305 on a top of a diffusion conductor 304, a gate conductor 303 between RSD conductors 302 and 305, a trench contact (TC2) conductor 306 between RSD 305 and trench contact (TC1) conductor 308, and trench contact (TC1) conductor 307. A domain 321 includes RSD conductor 305 on a top of diffusion conductor 304, a trench contact (TC2) conductor 306 between RSD 305 and a trench contact (TC1) conductor 308, a poly conductor 313, and a trench conductor (TC2) 314. A domain 322 includes trench contact (TC2) conductor 312 and a trench conductor (TC3) 316. A domain 323 includes an M2 conductor 312 and an M2 conductor 317. A domain 324 includes M2 conductor 312, an M2 conductor 311 over an M1 conductor 309 and an M1 conductor 310, TC1 conductor 307, a portion of TC1 308 and TC2 306. A domain 325 includes a M2 conductor 317 over trench contact (TC3) conductor 316. A domain 326 includes trench contact (TC2) conductor 314 and trench contact (TC2) conductor 315.

As shown in FIG. 3, a device model (illustrated by a dash line) is selected for domain 320. A hybrid model (illustrated by a dotted line) is selected for domains 321 and 322. An interconnect model (illustrated by a dash-and-dotted line) is selected for domains 323, 324, 325, and 326. In at least some embodiments, capacitance extraction for device region layout scenarios leveraging the canonical models is performed. As shown in FIG. 3, data from different models are combined to extract an overall capacity for the layout 300.

Figure 6:
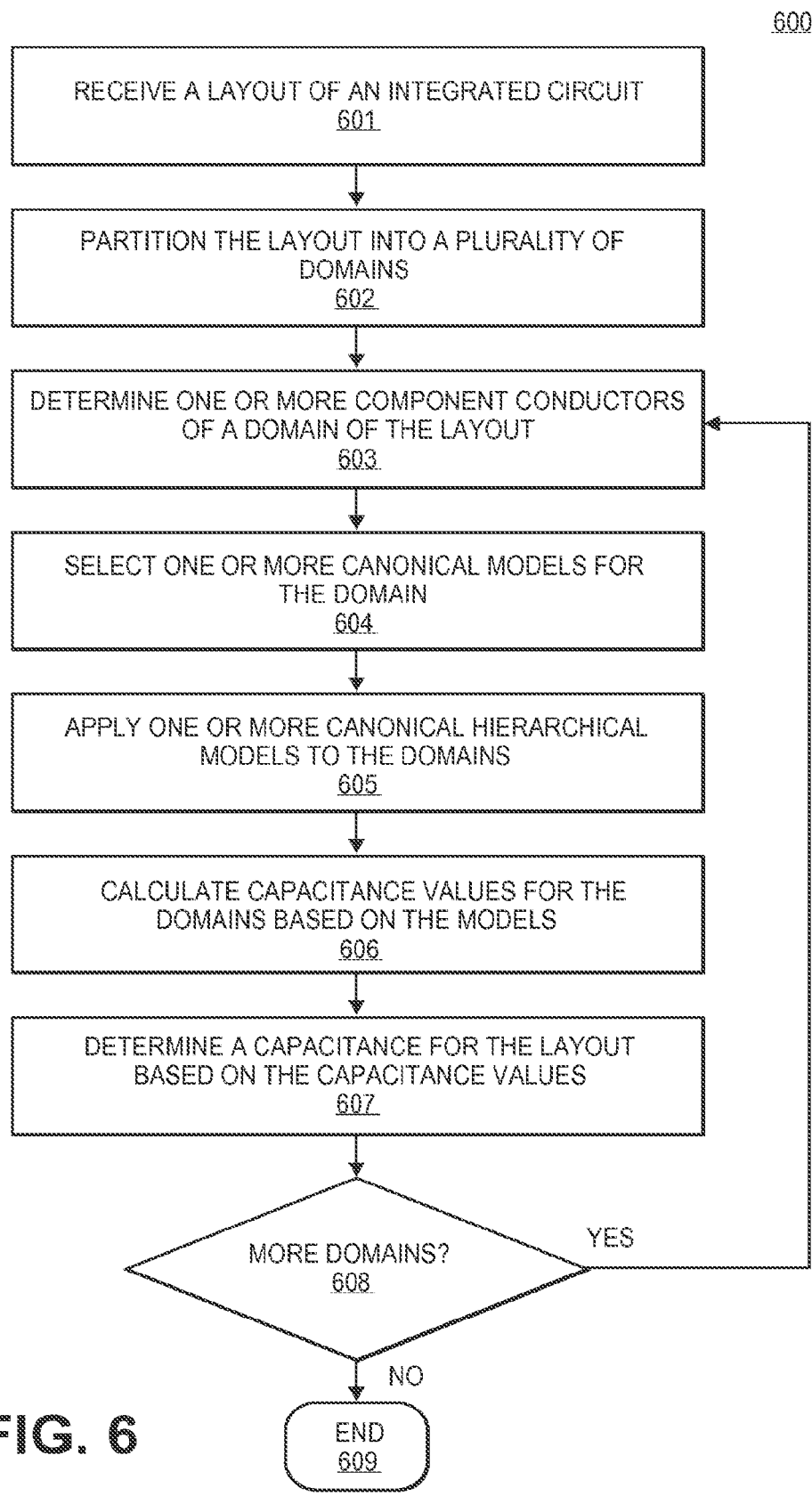
FIG. 6 shows a flowchart of a method to extract a capacitance according to one embodiment.

FIG. 6 shows a flowchart of a method 600 to extract a capacitance to design an integrated circuit according to one embodiment. A layout of the integrated circuit, such as layout 300 is received at operation 601. In at least some embodiments, the layout 300 of the integrated circuit is received after placement and routing of the components of the integrated circuit design. At operation 602 the layout is partitioned into a plurality of domains, such as domains 320-326. Automatic partitioning of layout scenarios is performed to use appropriate canonical models in the hierarchy. At operation 603 one or more conductors of a domain of the layout are determined. At operation 604 one or more canonical models are selected for the domain from a plurality of canonical models based on the one or more conductors. In at least some embodiments, the plurality of canonical models includes a device type canonical model to capture a capacitance of a device, and a hybrid type canonical model to capture a capacitance between at least a portion of the device and one or more other conductors of the integrated circuit, and an interconnect type canonical model to capture a capacitance between interconnect conductors of the integrated circuit. In at least some embodiments, the hybrid type canonical model acts as a bridge between the device type canonical model and the interconnect type canonical model.

In at least some embodiments, characteristics of one or more conductors of a domain of the layout of the integrated circuit design are determined. A canonical model for the domain is determined based on the characteristics of the one or more conductors. In at least some embodiments, a device model can be selected for a domain of the layout if conductors in the domain are a gate conductor, an RSD, and diffusion. In at least some embodiments, a hybrid model is selected for a domain of the layout if the conductors in the domain are an RSD, and a field poly. In at least some embodiments, an interconnect model is selected for the domain of the layout if the conductors in the domain are M1 conductors. In at least some embodiments, multiple canonical models are selected based on the conductors in the domain. For example, if a gate, trench contact, and M1 conductors exist in a given domain, both a device model and a hybrid model can be selected.

Figure 7:
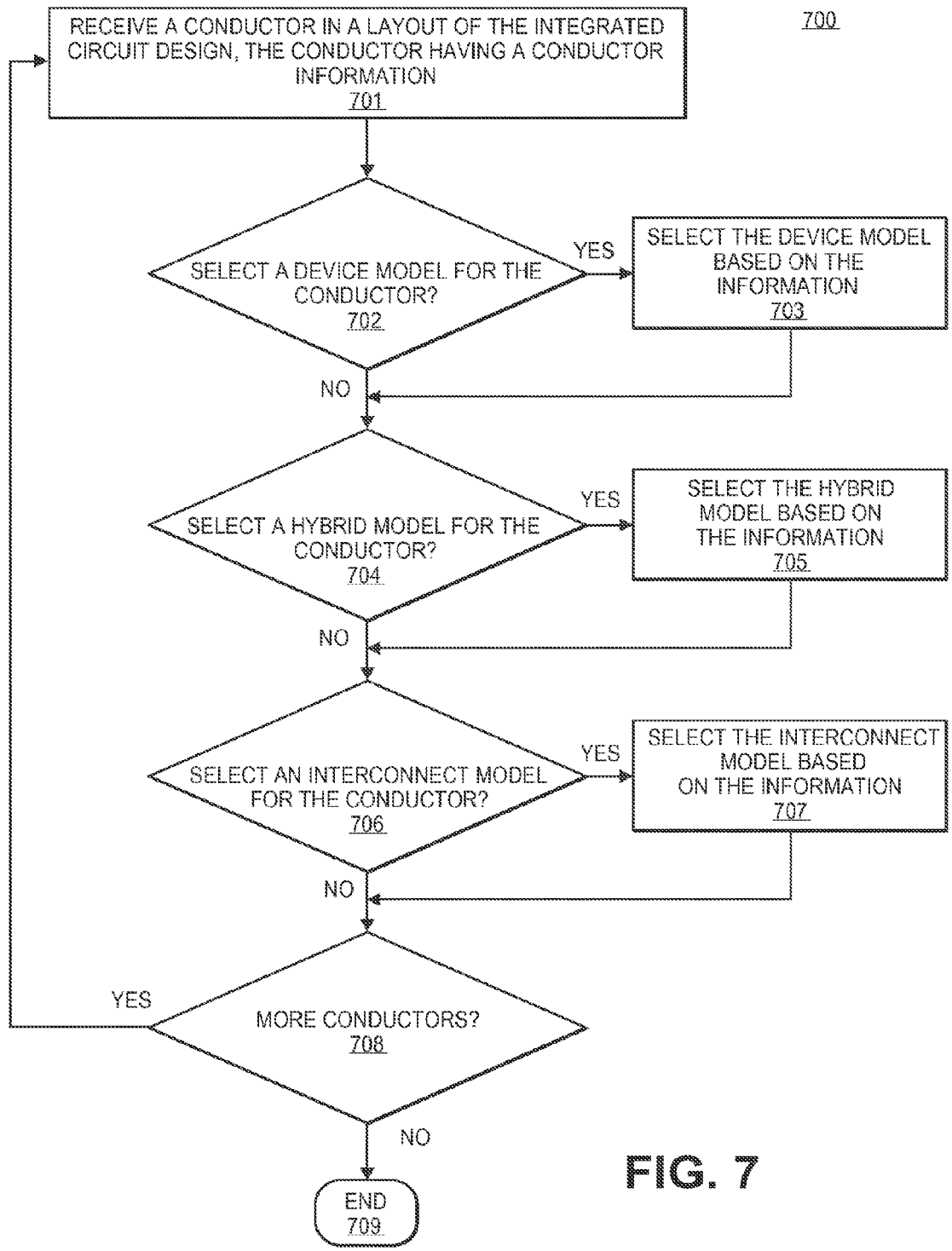
FIG. 7 shows a flowchart of a method to select one or more canonical models based on one or more conductors in an integrated circuit layout according to one embodiment.

FIG. 7 shows a flowchart of a method 700 to select one or more canonical models for extracting the capacitance of a conductor in an integrated circuit design layout according to one embodiment. Method 700 begins with operation 701 that involves receiving a conductor in a domain of an integrated circuit design layout, the conductor having conductor information (e.g., a conductor physical geometry, conductor function, capacitive behavior, design rules, information on other surrounding conductors in the domain, and the like). At operation 702 it is determined whether or not to select a device model for the conductor. The device model is selected for the conductor based on the conductor information at operation 703.

In at least some embodiments, a value of the capacitive effect of the conductor on the portion of the layout is determined. In at least some embodiments, if the difference between the capacitance values for the same portion of the design layout with and without the conductor is greater than a predetermined value, a canonical model is selected to extract the capacitance of the conductor because the conductor has a significant capacitive effect on the portion of the design. In at least some embodiments, if the difference between the capacitances of the same portion of the design layout with and without the conductor is not greater than a predetermined value, a canonical model is not selected for the conductor.

For example if a conductor is a gate contact, such as gate 303 shown in FIG. 3 that has a first order effect on the capacitance of a device, a device model is selected for the conductor For example, if a conductor is a field poly, such as a field poly 313 shown in FIG. 3 that has a very little impact on the capacitance of the device, a device model is not selected for the conductor At operation 704 it is determined whether or not to select a hybrid model for the conductor. The hybrid model for the conductor is selected based on the conductor information at operation 705. In at least some embodiments, if a conductor is a trench contact in a close proximity to a RSD that has a significant effect (e.g., greater than a predetermined threshold) on the capacitive interaction between the device and outside conductors, such as TC2 306, the hybrid model is selected to extract the capacitance of the conductor. In at least some embodiments, if the conductor is a gate contact in the layout that has a little effect (e.g., smaller than a predetermined threshold) on capacitive interaction between the device and outside conductors, such as gate 303, the hybrid model is not selected to extract the capacitance of the conductor.

At operation 706 it is determined whether or not to select an interconnect model for the conductor. The interconnect model is selected based on the conductor information at operation 707. In at least some embodiments, if a conductor is a routing interconnect conductor of M2 layer, such as M2 conductor 312 that has a significant capacitive effect (e.g., greater than a predetermined threshold) on the interconnect conductor interaction, the interconnect model is selected to extract the capacitance of the conductor. In at least some embodiments, if the conductor is an RSD, such as RSD 305 within the device that has a little effect (e.g., smaller than a predetermined threshold) on the interconnect conductor interaction, the interconnect model is not selected to extract the capacitance of the conductor.

Referring back to FIG. 3, TC1 308 that is in a close proximity to M1 conductor 310 is selected for the interconnect model. As shown in FIG. 3, M2 311 has almost no impact on the capacitance of the device including gate contact 303, and M2 311 is not included into a device model. In at least some embodiments, because base models do not exhaustively cover all possible scenarios in advanced device technologies including trench contacts, the base models are applied during capacitance extraction for a given conductor using for example, superposition, scaling, substitution, direct application, or a combination thereof operations. The exemplary canonical models potentially employed for extracting a capacitance using for example, superposition, scaling, substitution, direct application, or a combination thereof operations are represented by overlapping boxes in FIG. 3.

Referring back to FIG. 7, at operation 708 it is determined if there are more conductors. If there is a conductor, method 700 returns to operation 701. If there are no more conductors, method 700 ends. In at least some embodiments, pairs of operations 702-703, 704-705, 706-707, can be performed in any order. For example, a pair of operations, such as 702-703 can be performed after or before at least one of other pair of operations, such as 704-705, and 706-707.

Referring back to FIG. 6, at operation 605 one or more canonical models are applied to the domain. Method 600 continues with operation 607 involving calculating capacitance values for the domain based on the canonical models. At operation 608 a capacitance for the layout is calculated based on the capacitance values for the domain. At operation 608 it is determined whether or not more domains need to be considered? If yes, method 600 returns to operation 603. If not, method 600 ends at operation 609. The calculated capacitance values for the domains output from the canonical hierarchical models are combined using for example superposition, scaling, substitution, direct application, or a combination thereof operations to calculate the capacitance for the integrated circuit design layout.

In at least some embodiments, a superposition operation involves adding or subtracting capacitance values from multiple base models. In at least some embodiments, the capacitance values outputted from multiple base models for a given conductor are weighted and superimposed to provide a capacitance for the conductor. In at least some embodiments, the capacitance values from multiple models are weighted based on conductor geometric data or model data.

In at least some embodiments, a scaling operation involves using capacitance values and geometric data from multiple base models to construct scaling factors that are multiplied with model capacitance values. In at least some embodiments, a substitution operation involves extracting a capacitance for a conductor geometry that is not modeled explicitly in the base models using data from a model for a similar scenario. The direct application operation involves applying capacitance values from the base models for a given conductor directly during extraction.

In at least some embodiments, during the extraction of a given coupling capacitance between conductors in the integrated circuit layout, any or all of the aforementioned extraction operations may be combined. In at least some embodiments, superposition, scaling, and substitution operations are used to extract cross-domain capacitive effects where data from device models, hybrid models, and/or standard interconnect models are combined.

In at least some embodiments, substitution and direct application operations leveraging the device models are used to extract specific process features such as RSD and multigate device geometries that may be context dependent and have non-rectangular conductor geometries.

Capacitance extraction of advanced integrated circuit designs using methods and apparatuses described herein showed that an average capacitance error versus a standard field solver is reduced from 25.8% to 1.7%. Capacitance extraction of advanced integrated circuit designs using methods and apparatuses described herein is over one order of magnitude faster than existing techniques that use numerical field solvers. Methods and apparatuses described herein improve computational efficiency by reducing the number of scenarios that need to be modeled for capacitance extraction, increase accuracy of targeted device and hybrid models, and provide flexible means for modeling advanced device topologies.

Figure 8:
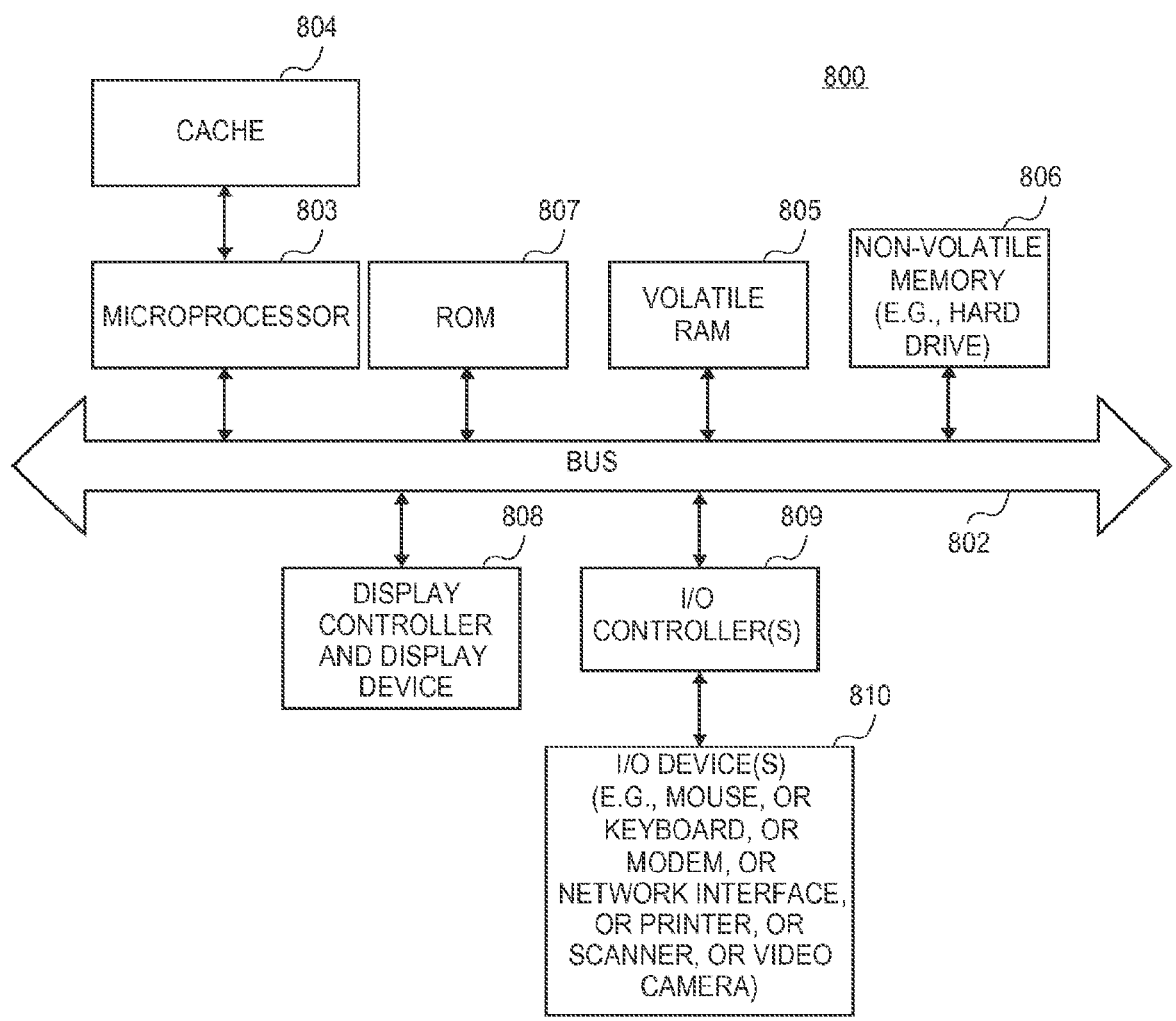
FIG. 8 shows one example of a data processing system according to one embodiment.

FIG. 8 shows one example of a data processing system according to one embodiment. Note that while FIG. 8 illustrates various components of a computer system, it is not intended to represent any particular architecture or manner of interconnecting the components as such details are not germane to the embodiments described herein. It will also be appreciated that network computers and other data processing systems which have fewer components or perhaps more components may also be used with the embodiments as described herein. The data processing r system of FIG. 8 may, for example, be an Apple Macintosh® computer.

As shown in FIG. 8, the data processing system 801 includes a bus 802 which is coupled to a microprocessor 803 and a ROM 807 and volatile RAM 805 and a non-volatile memory 806. The microprocessor 803, which may be, for example, a G3 or G4 microprocessor from Motorola, Inc., or IBM is coupled to cache memory 804 as shown in the example of FIG. 8. The bus 802 interconnects these various components together and also interconnects these components 803, 807, 805, and 806 to a display controller and display device(s) 808 and to peripheral devices such as input/output (I/O) devices 810 which may be mice, keyboards, modems, network interfaces, printers, scanners, video cameras and other devices which are well known in the art.

Typically, the input/output devices 810 are coupled to the system through input/output controllers 809. The volatile RAM 805 is typically implemented as dynamic RAM (DRAM) which requires power continually in order to refresh or maintain the data in the memory. The non-volatile memory 806 may be a magnetic hard drive, a magnetic optical drive, an optical drive or a DVD RAM and other type of memory systems which maintain data even after power is removed from the system. The non-volatile memory 806 may be a random access memory.

While FIG. 8 shows that the non-volatile memory is a local device coupled directly to the rest of the components in the data processing system, it will be appreciated that the embodiments as described herein may utilize a non-volatile memory which is remote from the system, such as a network storage device which is coupled to the data processing system through a network interface such as a modem or Ethernet interface. The bus 802 may include one or more buses connected to each other through various bridges, controllers and/or adapters as is well known in the art. In one embodiment the I/O controller 809 includes a USB (Universal Serial Bus) adapter for controlling USB peripherals, and/or an IEEE-1394 bus adapter for controlling IEEE-1394 peripherals.

It will be apparent from this description that aspects as described herein may be embodied, at least in part, in software. That is, the techniques may be carried out in a computer system or other data processing system in response to its processor, such as a microprocessor, executing sequences of instructions contained in a memory, such as ROM 807, volatile RAM 805, non-volatile memory 806, cache 804 or a remote storage device.

In various embodiments, hardwired circuitry may be used in combination with software instructions to implement the embodiments as described herein. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 803, or microcontroller.

A machine readable medium can be used to store software and data which when executed by a data processing system causes the system to perform various methods as described herein. This executable software and data may be stored in various places including for example ROM 807, volatile RAM 805, non-volatile memory 806 and/or cache 804 as shown in FIG. 8. Portions of this software and/or data may be stored in any one of these storage devices.

Thus, a machine readable medium includes any mechanism that provides (i.e., stores and/or transmits) information in a form accessible by a machine (e.g., a computer, network device, cellular phone, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; and the like.

The methods as described herein can be implemented using dedicated hardware (e.g., using Field Programmable Gate Arrays, or Application Specific Integrated Circuit) or shared circuitry (e.g., microprocessors or microcontrollers under control of program instructions stored in a machine readable medium. The methods as described herein can also be implemented as computer instructions for execution on a data processing system, such as system 800 of FIG. 8.

Many of the methods as described herein may be performed with a digital processing system, such as a conventional, general-purpose computer system. The computer systems may be, for example, entry-level Mac Mini® and consumer-level iMac® desktop models, the workstation-level Mac Pro® tower, and the MacBook® and MacBook Pro® laptop computers produced by Apple Inc., located in Cupertino, Calif. The computer systems may be, for example based on the PowerPC®, Intel Core Duo, AMD Athlon, AMD Turion processor, AMD Sempron, HP Pavilion PC, HP Compaq PC, and any other processor families. Small systems (e.g. very thin laptop computers) can benefit from the methods described herein. Special purpose computers, which are designed or programmed to perform only one function, or consumer electronic devices, such as a cellular telephone, may also perform the methods described herein.

In the foregoing specification, methods and apparatuses have been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A method to provide a capacitance to a design an integrated circuit comprising:
    receiving using a processor a layout of the integrated circuit;
    applying canonical hierarchical models to the layout, wherein the canonical hierarchical models include a first type canonical model representing a device having a plurality of first conductors to capture a first capacitance and a second type canonical model representing at least a portion of the device and one or more second conductors of the integrated circuit outside the device to capture a second capacitance; and
    determining a capacitance for the layout based on the applying.

2. The method of claim 1, further comprising
    determining one or more third conductors of a first domain of the layout; selecting the first type canonical model for the first domain based on the one or more third conductors;
    determining one or more fourth conductors of a second domain of the layout;
    selecting the second type canonical model for the second domain based on the one or more fourth conductors.

3. The method of claim 1, wherein the canonical hierarchical models include
    a third type canonical model to capture a third capacitance between the second conductors of the integrated circuit, and wherein the second type canonical model is configured to bridge the first type canonical model and the third type canonical model.

4. The method of claim 1, wherein the canonical hierarchical models are applied to the layout by a superposition operation, a scaling operation, a substitution operation, a direct application, or a combination thereof.

5. The method of claim 1, wherein the canonical hierarchical models are cross-parameterized by re-usable parameters.

6. The method of claim 1, further comprising combining data output of the canonical hierarchical models.

7. A non-transitory machine-readable storage medium storing instructions therein, which when executed by a data processing system, cause the data processing system to perform operations provide a capacitance to a design an integrated circuit, the operations comprising:

receiving a layout of the integrated circuit;

applying canonical hierarchical models to the layout, wherein the canonical hierarchical models include a first type canonical model representing a device having a plurality of first conductors to capture a first capacitance and a second type canonical model representing at least a portion of the device and one or more second conductors of the integrated circuit outside the device to capture a second capacitance; and determining a capacitance for the layout based on the applying.

8. The non-transitory machine-readable storage medium of claim 7, further comprising instructions to cause the data processing system to perform operations comprising determining one or more third conductors of a first domain of the layout;

selecting the first type canonical model for the first domain based on the one or more third conductors;

determining one or more fourth conductors of a second domain of the layout;

selecting the second type canonical model for the second domain based on the one or more fourth conductors.

9. The non-transitory machine-readable storage medium of claim 7, wherein the canonical hierarchical models include a third type canonical model to capture a third capacitance between the second conductors of the integrated circuit, and wherein the second type canonical model is configured to bridge the first type canonical model and the third type canonical model.

10. The non-transitory machine-readable storage medium of claim 7, wherein the canonical hierarchical models are applied to the layout by a superposition operation, a scaling operation, a substitution operation, a direct application, or a combination thereof.

11. The non-transitory machine-readable storage medium of claim 7, wherein the canonical hierarchical models are cross-parameterized by re-usable parameters.

12. The non-transitory machine-readable storage medium of claim 7, further comprising instructions to cause the data processing system to perform operations comprising combining data output of the canonical hierarchical models.

13. A data processing system to provide a capacitance to a design an integrated circuit comprising:

a memory, and a processor coupled to the memory, the processor is configured to receive a layout of the integrated circuit; to apply canonical hierarchical models to the layout, wherein the canonical hierarchical models include a first type canonical model representing a device having a plurality of first conductors to capture a first capacitance and a second type canonical model representing at least a portion of the device and one or more second conductors of the integrated circuit outside the device to capture a second capacitance; and to determine a capacitance for the layout based on the applying.

14. The data processing system of claim 13, wherein the processor is further configured to determine one or more third conductors of a first domain of the layout;

to select the first type canonical model for the first domain based on the one or more third conductors; to determine one or more fourth conductors of a second domain of the layout; and to select the second type canonical model for the second domain based on the one or more fourth conductors.

15. The data processing system of claim 13, wherein the canonical hierarchical models include a third type canonical model to capture a third capacitance between the second conductors of the integrated circuit, and wherein the second type canonical model is configured to bridge the first type canonical model and the third type canonical model.

16. The data processing system of claim 13, wherein the canonical hierarchical models are applied to the layout by a superposition operation, a scaling operation, a substitution operation, a direct application, or a combination thereof.

17. The data processing system of claim 13, wherein the canonical hierarchical models are cross-parameterized by re-usable parameters.

18. The data processing system of claim 13, wherein the processor is further configured to combine data output of the canonical hierarchical models.

\* \* \* \* \*